(12) United States Patent
Usami

(10) Patent No.: US 10,158,036 B2
(45) Date of Patent: Dec. 18, 2018

(54) SEMICONDUCTOR DEVICE AND ITS MANUFACTURING METHOD

(71) Applicant: Renesas Electronics Corporation, Tokyo (JP)

(72) Inventor: Tatsuya Usami, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 23 days.

(21) Appl. No.: 15/469,455

(22) Filed: Mar. 24, 2017

(65) Prior Publication Data

US 2017/0317221 A1 Nov. 2, 2017

(30) Foreign Application Priority Data

May 2, 2016 (JP) ................................ 2016-092400

(51) Int. Cl.
*H01L 31/0352* (2006.01)
*H01L 31/028* (2006.01)
*H01L 31/109* (2006.01)
*H01L 31/18* (2006.01)
*G02B 6/12* (2006.01)
(Continued)

(52) U.S. Cl.
CPC .......... *H01L 31/03529* (2013.01); *G02B 6/00* (2013.01); *G02B 6/12004* (2013.01); *H01L 31/028* (2013.01); *H01L 31/0224* (2013.01); *H01L 31/035281* (2013.01); *H01L 31/105* (2013.01); *H01L 31/109* (2013.01); *H01L 31/1804* (2013.01); *H01L 31/1808* (2013.01)

(58) Field of Classification Search
None
See application file for complete search history.

(56) References Cited

U.S. PATENT DOCUMENTS 6,075,253 A * 6/2000 Sugiyama ............. H01L 31/028
257/19
2017/0012143 A1* 1/2017 Usami ................. H01L 31/0288

FOREIGN PATENT DOCUMENTS

JP 10-290023 A 10/1998

OTHER PUBLICATIONS

J. Fujikata, M. Noguchi. M. Miura, D. Okamoto, T, Horikawa,and Y. Arakawa, "High Performance Silicon Waveguide-Integrated PIN and Schottky Ge Photodiodes and their Link with Inverter-Type CMOS TIA Circuits" Extended Abstracts of the 2013 International Conference on Solid State Devices and Materials, Fukuoka, Japan, 2013, pp. 980-981.

* cited by examiner

*Primary Examiner* — Asok K Sarkar
*Assistant Examiner* — Grant Withers
(74) *Attorney, Agent, or Firm* — McGinn I.P. Law Group, PLLC.

(57) ABSTRACT

There is to provide a semiconductor device including a light receiving element capable of reducing the manufacturing cost and improving the optical performance of the light receiving element. For example, a p type germanium layer, an intrinsic germanium layer, and an n type germanium layer forming the structure body of a Ge photodiode are formed according to a continuous selective epitaxial growth. An insulating film having an opening portion is formed on the silicon layer of a SOI substrate, and an intrinsic germanium layer is formed bulging from the opening portion to above the insulating film. In short, by using the insulating film having the opening portion, the cross section of the intrinsic germanium layer is formed into a mushroom shape.

14 Claims, 12 Drawing Sheets

(51) Int. Cl.
*H01L 31/0224* (2006.01)
*H01L 31/105* (2006.01)
*G02B 6/00* (2006.01)

US 10,158,036 B2

SEMICONDUCTOR DEVICE AND ITS MANUFACTURING METHOD

CROSS-REFERENCE TO RELATED APPLICATIONS

The disclosure of Japanese Patent Application No. 2016-092400 filed on May 2, 2016 including the specification, drawings and abstract is incorporated herein by reference in its entirety.

BACKGROUND

The invention relates to a semiconductor device and its manufacturing technique and particularly, to a technique which is effectively applied to a semiconductor device and its manufacturing technique, for example, including a light receiving element (light receiver) having a photoelectric conversion function.

Japanese Unexamined Patent Application Publication No. Hei 10 (1998) -290023 describes a technique for forming an N-type germanium layer, a germanium single crystal layer, a P-type germanium layer, and a P-type silicon layer, within a groove formed in the N-type epitaxial layer.

In "High Performance Silicon Waveguide-Integrated PIN and Schottky Ge Photodiodes and their Link with Inverter-Type CMOS TIA Circuits" Extended Abstracts of the 2013 International Conference on Solid State Devices and Materials, Fukuoka, 2013, pp 980-981, written by J. Fujikata, M. Noguchi, M. Miura, D. Okamoto, T. Horikawa, and Y. Arakawa, there are described a PIN Ge photodiode and a Schottky Ge photodiode including a p+ ntype silicon layer formed on a silicon substrate through an embedded insulting layer, a germanium layer formed on the p+ type silicon layer, an n+ type silicon germanium layer (or non-doped silicon germanium layer) formed on the germanium layer.

SUMMARY

A light receiving element having a photoelectric conversion function is requisite for the silicon photonics technology, in order to merge an optical circuit and an electron circuit. Especially, in the silicon photonics technology of using a silicon layer as an optical waveguide layer, a photodiode, for example, using germanium having a smaller bandgap than that of silicon is used as the light receiving element to absorb a light transmitted through the silicon layer. The inventor el al., however, have found that a photodiode using germanium is difficult both to reduce the manufacturing cost and improve the optical performance. In short, the light receiving element used in the silicon photonics technology has room for improvement, from the both viewpoints of the reduction in the manufacturing cost and the improvement in the optical performance.

Other objects and novel features will be apparent from the description of the specification and the attached drawings.

Using an insulating film having a first surface and a second surface crossing the first surface, a semiconductor device according to one embodiment forms a stacked structure including a first semiconductor layer in contact with the first surface, an intrinsic semiconductor layer in contact with both the first surface and the second surface, and a second semiconductor layer in contact with the second surface.

According to one embodiment, a semiconductor device including a light receiving element can reduce the manufacturing cost and improve the optical performance of the light receiving element.

DETAILED DESCRIPTION

Figure 1:
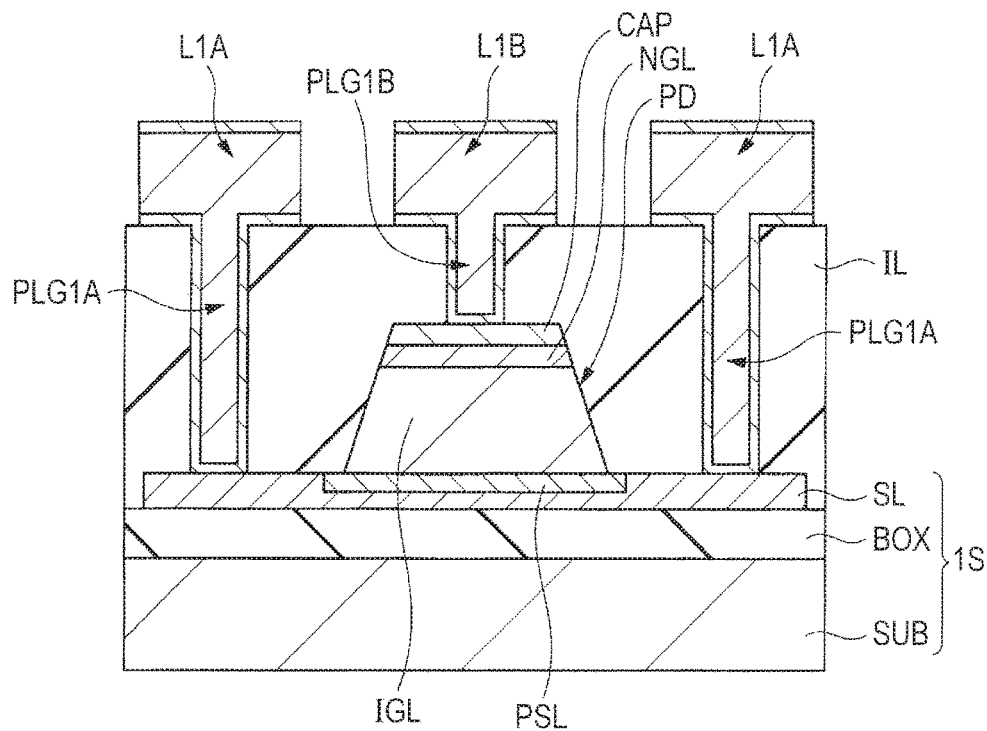
FIG. 1 is a cross-sectional view showing a schematic structure of a semiconductor device including a Ge photodiode in the related art.

The following embodiments, if the necessity arises for the sake of convenience, will be described divided into a plurality of sections or forms; unless otherwise specified, they are mutually related to each other and one is related to the other in a part or in the whole of the modified examples, details or supplementary description.

Further, in case of referring to the number of the elements (including piece, numeric value, amount, and range), in the following embodiments, the number is not restricted to the specific number but maybe more or less than the specified number, unless particularly specified and unless restricted to the specified number apparently on the principle.

Further, in the following embodiments, the components (including operation steps) are not always essential unless particularly specified and unless apparently considered compulsory on the principle.

Similarly, in the following embodiments, when referring to the shape and the positional relation of the components, they are to include their similarity or approximation unless particularly specified and unless they have apparently different shape and positional relation on the principle. This is true to the above number and range.

In all the drawings for describing the embodiments, the same reference numerals are attached to the same components in principle and their repeated description is omitted. For the sake of easy understanding in the drawings, hatching may be occasionally attached even to the top plan views.

First Embodiment

In these days, silicon photonics technology as a technology for realizing a module for optical communication is actively developed, in which transmission lines (optical waveguides) for optical signals made of silicon (Si) are formed in a substrate as an optical circuit and the optical circuit is used as a platform to integrate various optical devices and electron devices.

The optical circuit of basically using the optical waveguides formed on the substrate made of silicon, mainly uses a silicon waveguide with a core layer made of silicon covered with a clad layer made of silicon oxide having a smaller refractive index than the silicon. Silicon is a material widely used in the electron circuits, and by using the silicon waveguide, an optical circuit and an electron circuit can be formed on the same substrate.

In order to merge the optical circuit and the electron circuit, a light receiving element (light receiver) for converting optical signals into electric signals is required; as the light receiving element used in the silicon photonics technology, a light receiving element using germanium (Ge) having a smaller bandgap (forbidden band width) than the silicon is considered. That is because in order to perform the photoelectric conversion on the near infrared communication wavelength band of about 1.6 µm, the bandgap has to be smaller than the near infrared energy. Further, the germanium has a high affinity for silicon and therefore, the light receiving element using the germanium can be monolithically formed on the silicon waveguide.

On the assumption that the photodiode using the germanium (hereinafter, referred to as Ge photodiode) is used as the light receiving element, the first embodiment contributes both to reduce the manufacturing cost and to improve the optical performance in the Ge photodiode. In the below, room for improvement newly found by the inventor et al, will be described using the related art, at first, and then, the technical spirit in the first embodiment will be described as a device for the improvement.

<Description of the Related Art>

The "related art" in this specification means the technique having a problem newly found by the inventor et al., not the well-known conventional art, but the technique described with the intention of the novel technical spirit (not well-known).

FIG. 1 is a cross-sectional view showing a schematic structure of a semiconductor device including a Ge photodiode in the related art. In FIG. 1, the semiconductor device in the related art includes, for example, a supporting substrate SUB formed of silicon single crystal, an embedded insulating layer BOX formed on the supporting substrate SUB, and a Silicon On Insulator (SOI) substrate 1S made of a silicon layer SL formed on the embedded insulating layer BOX. The silicon layer SL of the SOI substrate 1S is patterned and this patterned silicon layer SL works as the optical waveguide.

In the related art shown in FIG. 1, a Ge photodiode PD is formed as the light receiving element, in contact with the silicon layer SL. Specifically, the Ge photodiode PD includes a p type silicon layer PSL formed within the silicon layer SL and a structure body formed on the silicon layer SL, as shown in FIG. 1. The structure body is formed on the p type silicon layer PSL, including an intrinsic germanium layer IGL, an n type germanium layer NGL formed on the intrinsic germanium layer IGL, and a cap layer CAP formed on the n type germanium layer NGL. According to this, the Ge photodiode PD forms the PIN-type photodiode.

Further, as shown in FIG. 1, an interlayer insulating film IL is formed to cover the silicon layer SL having the Ge photodiode arranged there and a plug PLG1A and a plug PLG1B penetrating the interlayer insulating film IL are formed in the interlayer insulating film IL. For example, the plug PLG1A is coupled to the silicon layer SL and the plug PLG1B is coupled to the cap layer CAP formed in the upmost layer of the Ge photodiode PD. As shown in FIG. 1, a first layer wiring is formed on the interlayer insulating film IL having the plug PLG1A and the plug PLG1B formed there and the first layer wiring includes, for example, a wiring L1A coupled to the plug PLG1A and a wiring L1B coupled to the plug PLG1B.

In thus-constituted Ge photodiode PD in the related art, the cross section of the structure body formed on the silicon layer SL has a trapezoid shape (facet shape or forward taper shape). This is because the intrinsic germanium layer IGL forming the structure body is formed according to the epitaxial growth and in a direction of growing a crystal, the cross section of the structure body becomes a trapezoid shape. In the Ge photodiode FD in the related art, by using the ion implantation, for example, the p type dopant represented by phosphorus is introduced to the surface of the intrinsic germanium layer IGL. As the result, the n type germanium layer NGL can be formed on the intrinsic germanium layer IGL.

When using the ion implantation as a method of forming the n type germanium layer NGL, however, there are a plurality of processes such as application of a photoresist film→exposure and development (patterning) of the photoresist film→ion implantation→removal of the photoresist film. This means an increase in the number of the processes of forming the n type germanium layer NGL, which disadvantageously increases the manufacturing cost in the related art. Further, in the ion implantation, the top of the n type germanium layer NGL is easily damaged; for example, there is a fear of increasing the defective crystals. Increase of the defective crystals means an increase of dark current in the Ge photodiode PD, which deteriorates the S/N ratio in the Ge photodiode PD. In short, the dark current means a noise current flowing in the Ge photodiode, regardless of irradiating the Ge photodiode PD with no light. When this dark current becomes larger, the noise component (dark current) for the current (signal) flowing when the Ge photodiode PD is irradiated with light becomes larger, which deteriorates the detection sensibility of the Ge photodiode. When the ion implantation is used as the method of forming the n type germanium layer NGL, like the related art, the manufacturing cost rises and the performance of the Ge photodiode PD deteriorates. Therefore, it is found that the related art has to be improved for the manufacturing cost and the performance of the Ge photodiode PD.

Focusing on the manufacturing cost, the related art as shown in FIG. 1 is to be improved. Specifically, instead of the ion implantation, a continuous epitaxial growth is used in the manufacturing process of the Ge photodiode.

Figure 2:
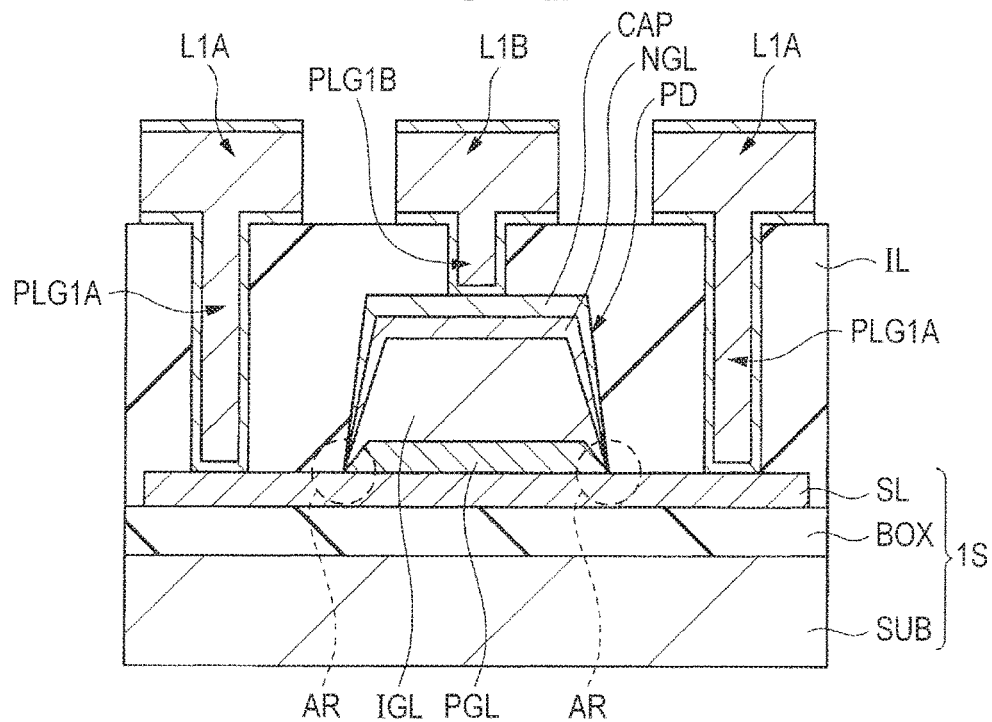
FIG. 2 is a cross-sectional view showing a schematic structure of the consideration technique focusing on the manufacturing cost.

Hereinafter, this consideration technique will be described. FIG. 2 is a cross-sectional view showing a schematic structure of the consideration technique focusing on the manufacturing cost. In FIG. 2, the structure body forming the Ge photodiode is formed on the silicon layer SL of the SOI substrate 1S also in the consideration technique but formed according to the continuous epitaxial growth in the consideration technique. Specifically, as shown in FIG. 2, a p type germanium layer PGL with a p type dopant (boron) introduced there is formed on the silicon layer SL at first, according to the epitaxial growth and then, an intrinsic germanium layer IGL is formed according to the epitaxial growth with the doping gas stopped. Further, according to the epitaxial growth, an n type germanium layer NGL with an n type dopant (phosphorus) introduced there is formed on the intrinsic germanium layer IGL. According to this, the structure body forming the Ge photodiode can be formed. Here, in the consideration technique, instead of using the ion implantation including the photolithography process, the continuous epitaxial growth is used in the process of forming the structure body, hence to reduce the number of the processes. In short, in the consideration technique, instead of the ion implantation, the continuous epitaxial growth is used, hence to reduce the manufacturing cost. Further, in the consideration technique, the ion implantation is not used, hence to avoid such a disadvantage from occurring as an increase of the dark current in the Ge photodiode caused by the damage accompanying the ion implantation. According to the consideration technique, it is found that the manufacturing cost can be reduced and at the same time, that the performance of the Ge photodiode PD can be improved.

The inventor et al., however, have found a new object for improvement in the consideration technique; therefore, this point will be described. In FIG. 2, in the consideration technique, the structure body of the Ge photodiode PD is formed according to the continuous epitaxial growth. Here, in the continuous epitaxial growth, as shown in FIG. 2, the cross section of the structure body of the Ge photodiode PD is formed into a trapezoid shape in relation to the growing crystal orientation. As the result, paying attention to the area AR of FIG. 2, the p type germanium layer PGL becomes closer to the n type germanium layer NGL. This means that in the vicinity of the area AR, interdiffusion of conductivity type dopant easily occurs between the p type germanium layer PGL and the n type germanium layer NGL. The interdiffusion of the conductivity type dopant between the p type germanium layer PGL and the n type germanium layer NGL means that the n type dopant is introduced to the p type germanium layer PGL and that the p type dopant is introduced to the n type germanium layer NGL. This means that the p type germanium layer PGL does not work well as the p type semiconductor layer and that the n type germanium layer NGL does not work well as the n type semiconductor layer. In other words, the consideration technique using the continuous epitaxial growth, instead of the ion implantation, is expected to reduce the manufacturing cost and to improve the performance of the Ge photodiode PD, compared with the related art using the ion implantation. Actually, however, there occurs a new problem such as the interdiffusion of the conductivity type dopant between the p type germanium layer PGL and the n type germanium layer NGL because the cross section of the structure body of the Ge photodiode PD formed according to the continuous epitaxial growth becomes a trapezoid shape. In short, both the manufacturing cost and the performance of the Ge photodiode PD cannot be improved by simply using the continuous epitaxial growth instead of the ion implantation but there is still room for improvement because of the property inherent in the continuous epitaxial growth.

As mentioned above, the inventor et al. have newly found that the continuous epitaxial growth has a fear of causing the interdiffusion of the conductivity type dopant between the p type germanium layer PGL and the n type germanium layer NGL, as the room for improvement because of the property inherent in the above method and resolved the above problem to improve the performance of the Ge photodiode PD while using the continuous epitaxial growth. Hereinafter, the technical spirit in the first embodiment will be described.

<Structure of Ge Photodiode>

Figure 3:
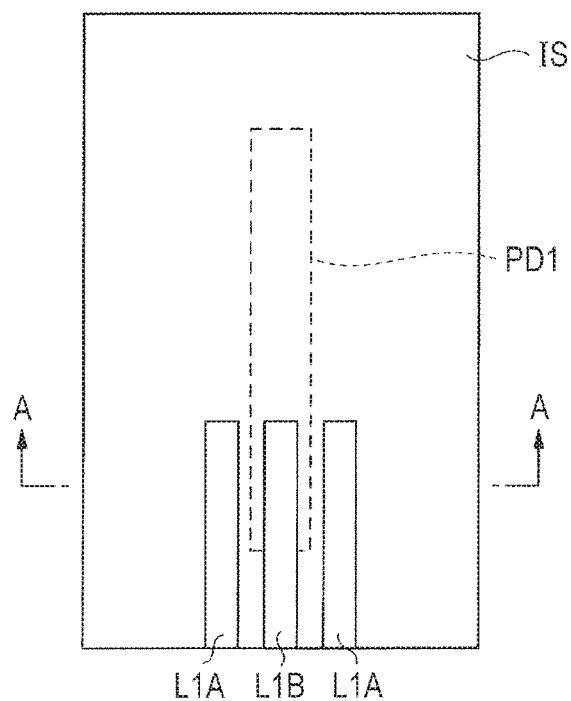
FIG. 3 is a top plan view showing a schematic structure of a Ge photodiode according to a first embodiment.

FIG. 3 is a top plan view showing a schematic structure of the Ge photodiode PD1 according to the first embodiment. In FIG. 3, the Ge photodiode PD1 according to the first embodiment is formed on the SOI substrate 1S. The Ge photodiode PD1 in the first embodiment is electrically coupled to the wiring L1A and the wiring L1B and this Ge photodiode PD1 includes a portion overlapping with the wiring L1A and wiring L1B in plan view and a portion not overlapping with the wiring L1A and the wiring L1B in plan view. In other words, the Ge photodiode PD1 in the first embodiment is a light receiving element having a photoelectric conversion function, formed in a way capable of receiving incident light in the portion not overlapping with the wiring L1A and the wiring L1B in plan view. In short, the Ge photodiode PD1 (light receiving element) according to the first embodiment is formed in a way capable of receiving light incident above the Ge photodiode PD1.

Figure 4:
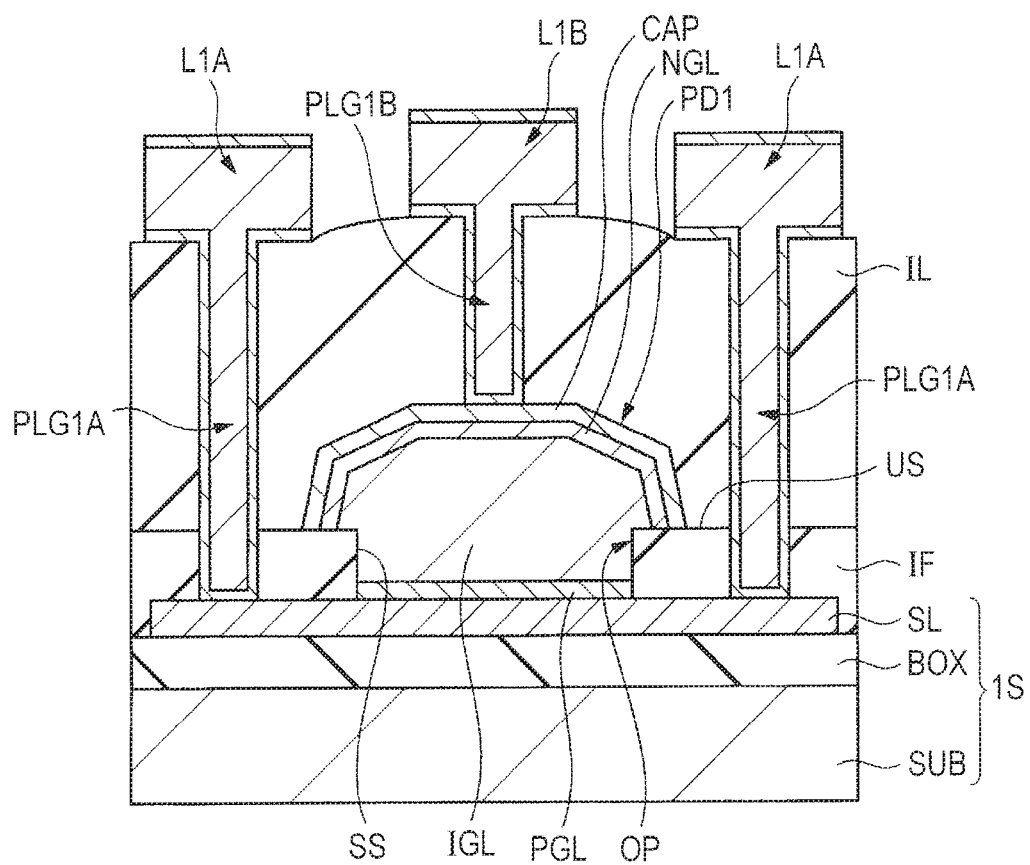
FIG. 4 is a cross-sectional view cut along the line A-A in FIG. 3.

FIG. 4 is a cross-sectional view cut along the line A-A of FIG. 3. As shown in FIG. 4, the Ge photodiode PD is formed on the SOI substrate 1S including, for example, the supporting substrate SUB formed of silicon single crystals, the embedded insulating layer BOX formed on the supporting substrate SUB, and the silicon layer SL formed on the embedded insulating layer BOX. Here, the silicon layer SL of the SOI substrate 1S works as an optical waveguide layer and the Ge photodiode PD1 is formed in a way capable of receiving light transmitted through the silicon layer SL working as the optical waveguide layer. In short, the Ge photodiode PD1 in the first embodiment has the portion not overlapping with the wiring L1A and the wiring L1B shown in FIG. 3 in plan view and therefore, it can receive the light incident above the Ge photodiode PD1. Further, the Ge photodiode PD1 in the first embodiment is formed in contact with the silicon layer SL and therefore, it can also receive the light transmitted through the silicon layer SL working as the optical waveguide layer. In other words, the Ge photodiode PD1 in the first embodiment is formed in a way capable of receiving lights from different incident directions; it can work as the light receiving element for the light incident above the Ge photodiode PD1 and also work as the light receiving element for the light transmitted through the silicon layer SL as the optical waveguide layer.

Continuously, as shown in FIG. 4, for example, an insulating film IF made of silicon oxide is formed to cover the silicon layer SL of the SOI substrate 1S. Then, an opening portion OP is formed in the insulating film IF and a part of the surface of the silicon layer SL is bared from the opening portion OP.

On the surface of the silicon layer SL bared from the opening portion OP, a p type germanium layer PGL is formed to be accommodated into the opening portion OP. An intrinsic germanium layer IGL is formed on the p type germanium layer PGL. This intrinsic germanium layer IGL fills the opening portion OP and a part of the intrinsic germanium layer IGL bulges from the opening portion OP to the upper surface US of the insulating film IF in direct contact with the above surface. As shown in FIG. 4, the intrinsic germanium layer IGL is formed in contact with the side surface SS of the insulating film IF bared from the opening portion OP and at the same time, in contact with the upper surface US of the insulating film IF having the opening portion OP. As the result, for example, as shown in FIG. 4, the cross section of the intrinsic germanium layer IGL becomes a mushroom shape. The n type germanium layer NGL is formed to cover the surface of the intrinsic germanium layer IGL and as the result, the n type germanium layer NGL is in contact with the upper surface US of the insulating film IF. Further, a cap layer CAP is formed to cover the surface of this n type germanium layer NGL and the cap layer CAP is in contact with the upper surface of the insulating film IF. The cap layer CAP is formed of, for example, phosphorus (n type dopant) doped silicon layer or silicon germanium layer (SiGe layer).

As mentioned above, the structure body of the Ge photodiode PD1 in the first embodiment is formed on the silicon layer SL of the SOI substrate 1S. As shown in FIG. 4, the Ge photodiode PD1 in the first embodiment includes the insulating film IF having the side surface SS and the upper surface US crossing the side surface SS and the p type germanium layer in contact with the side surface SS of the insulating film IF. Especially, in the first embodiment, the opening portion OP is formed penetrating the insulating film IF and the side surface SS of the insulating film is the inner wall surface of the opening portion OP. The Ge photodiode PD1 in the first embodiment includes the intrinsic germanium layer IGL formed on the p type germanium layer PGL in contact with the side surface SS and the upper surface US of the insulating film IF and the n type germanium layer NGL formed on the intrinsic germanium layer IGL in contact with the upper surface US of the insulating film IF.

As the result, as shown in FIG. 4, the structure body of the Ge photodiode PD1 in the first embodiment is formed from the opening portion OP penetrating the insulating film IF, bulging above the upper surface US of the insulating film IF. Further, the structure body of the Ge photodiode PD1 in the first embodiment is formed on the silicon layer SL of the SOI substrate 1S. Here, the silicon layer SL is formed of silicon (Si), while the p type germanium layer PGL, the intrinsic germanium layer IGL, and the n type germanium layer NGL forming the structure body of the Ge photodiode PD1 is formed of germanium (Ge). Therefore, the bandgap of the silicon layer SL becomes larger than the bandgap of any layer of the p type germanium layer PGL, the intrinsic germanium layer IGL, and the n type germanium layer NGL.

As shown in FIG. 4, for example, the interlayer insulating film IL made of silicon oxide is formed to cover the Ge photodiode PD1 formed on the SOI substrate 1S. Then, the plug PLG1A is formed penetrating the interlayer insulating film IL and the insulating film IF to arrive at the silicon layer SL of the SOI substrate 1S and this plug PLG1A is electrically coupled to, for example, the wiring L1A formed on the upper surface of the interlayer insulating film IL. Further, in the interlayer insulating film IL, the plug PLG1B ranging from the upper surface of the interlayer insulating film IL to the cap layer CAP of the Ge photodiode PD1 is formed and this plug PLG1B is electrically coupled to, for example, the wiring L1B formed on the upper surface of the interlayer insulating film IL. The plug PLG1A and the plug PLG1B are formed of, for example, barrier conductive film made of titanium and titanium nitride and aluminum film (aluminum alloy film) and the wiring L1A and the wiring L1B are similarly formed of, for example, barrier conductive film made of titanium and titanium nitride and aluminum film (aluminum alloy film).

According to the Ge photodiode PD1 in the first embodiment constituted above, the intrinsic germanium layer IGL sandwiched between the p type germanium layer PGL and the n type germanium layer NGL is depleted and works as the depletion layer. As the result, when the light having a larger energy than the bandgap of the germanium enters the intrinsic germanium layer working as the depletion layer, valence band electrons are excited to the conduction band, hence to generate hole and electron pairs. The electrons excited to the conduction band are injected into the n type germanium layer NGL according to the electric field within the depletion layer, while the holes formed in the valence band are injected into the p type germanium layer PGL according to the electric field within the depletion layer. According to this, the electrons injected into the n type germanium layer NGL flow along a path of the n type germanium layer NGL→the cap layer CAP→the plug PLG1B→the wiring L1B. On the other hand, the holes injected into the p type germanium layer PGL flow along a path of the p type germanium layer PGL→the silicon layer SL→the plug PLG1A→the wiring L1A. As mentioned above, according to the Ge photodiode PD1 in the first embodiment, it is found that a photoelectric conversion function for converting the incident light into electric signals (current) is realized.

<Manufacturing Method of Semiconductor Device>

A semiconductor device including the Ge photodiode according to the first embodiment is formed as mentioned above and hereinafter, the manufacturing method thereof will be described with reference to the drawings.

Figure 5:
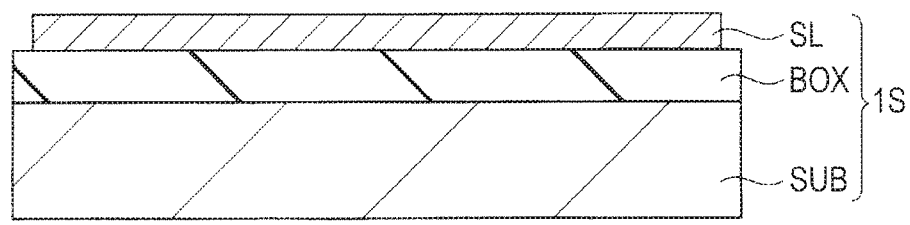
FIG. 5 is a cross-sectional view showing a manufacturing process of a semiconductor device according to the first embodiment.

At first, as shown in FIG. 5, the SOI substrate 1S including the supporting substrate SUB, the embedded insulating layer BOX formed on the supporting substrate SUB, and the silicon layer SL formed on the embedded insulating layer BOX is prepared. Then, the silicon layer SL of the SOI substrate 1S is patterned according to the photolithography and the etching. Specifically, patterning of the silicon layer SL is performed to form the optical waveguide layer.

Figure 6:
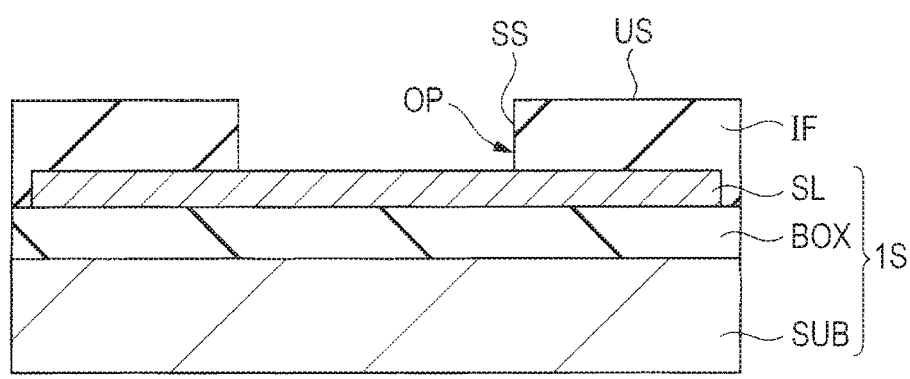
FIG. 6 is a cross-sectional view showing the manufacturing process of the semiconductor device following FIG. 5.

As shown in FIG. 6, the insulating film IF for covering the patterned silicon layer SL is formed. This insulating film IF can be formed of, for example, silicon oxide, according to the Chemical Vapor Deposition (CVD) by way of example. According to this, the patterned silicon layer SL is surrounded by the embedded insulating layer BOX and the insulating film IF. Since the refractive index of the silicon oxide film is smaller than the refractive index of the silicon layer SL, the silicon layer SL having the larger refractive index is used for the core layer and the silicon oxide film having the smaller refractive index is used for the clad layer, to form the optical waveguide. The light passing through the silicon layer SL is completely reflected by the clad layer having the smaller refractive index and transmitted to the silicon layer SL as the core layer without any leakage to the clad layer.

Continuously, as shown in FIG. 6, the opening portion OP is formed penetrating the insulating film IF according to the photolithography and the etching. According to this, the insulating film IF having the opening portion OP includes the side surface SS as the inner wall surface of the opening portion OP and the upper surface US crossing this side surface SS. As the result of forming the opening portion OP in the insulating film IF, a part of the surface of the silicon layer SL is bared from the bottom surface of the opening portion OP.

Figure 7:
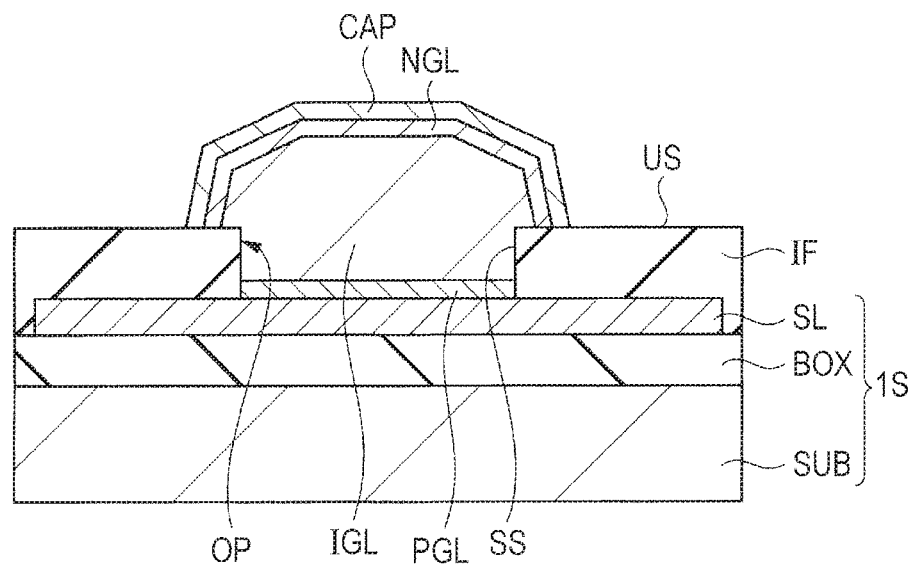
FIG. 7 is a cross-sectional view showing the manufacturing process of the semiconductor device following FIG. 6.

Then, as shown in FIG. 7, the p type germanium layer PGL is formed on the surface of the silicon layer SL bared from the bottom surface of the opening portion OP, according to the selective epitaxial growth. Specifically, the p type germanium layer PGL forms a boron (boron: p type dopant) doped germanium layer, mainly according to the selective epitaxial growth including monogerman gas and diboran gas. Here, as shown in FIG. 7, the p type germanium layer PGL is formed to be accommodated into the opening portion OP formed in the insulating film IF.

With the dopant gas (diboran gas) supply stopped, within the same chamber, according to the selective epitaxial growth including the monogerman gas, the non-doped intrinsic germanium layer IGL without any conductivity type dopant is formed on the p type germanium layer PGL, starting from the p type germanium layer PGL bared from the bottom surface of the opening portion OP. Here, the intrinsic germanium layer IGL bulges from the opening portion OP to above the upper surface US of the insulating film IF. In other words, in the first embodiment, the intrinsic germanium layer IGL is formed in contact with the side surface SS (the inner wall surface of the opening portion OP) of the insulating film IF and the upper surface US of the insulating film IF. As the result, the cross section of the intrinsic germanium layer IGL formed according to the first embodiment becomes a mushroom shape.

Next, within the same chamber, according to the selective epitaxial growth with the phosphine gas added to the monogerman gas, then type germanium layer NGL is formed to cover the surface of the intrinsic germanium layer IGL. As the result, as shown in FIG. 7, the n type germanium layer NGL is formed to cover the surface of the intrinsic germanium layer IGL and at the same time, formed in contact with the upper surface US of the insulating film IF in its end portion.

Then, according to the selective epitaxial growth using a silane-based gas, the cap layer CAP made of, for example, phosphorus doped silicon (Si) is formed to cover the surface of the n type germanium layer NGL. Also this cap layer CAP is formed in contact with the upper surface US of the insulating film IF in its end portion. As mentioned above, the structure body of the Ge photodiode including the p type germanium layer PGL, the intrinsic germanium layer IGL, the n type germanium layer NGL, and the cap layer CAP, can be formed within the same chamber, according to the continuous selective epitaxial growth with the supplying material gas switched.

Figure 8:
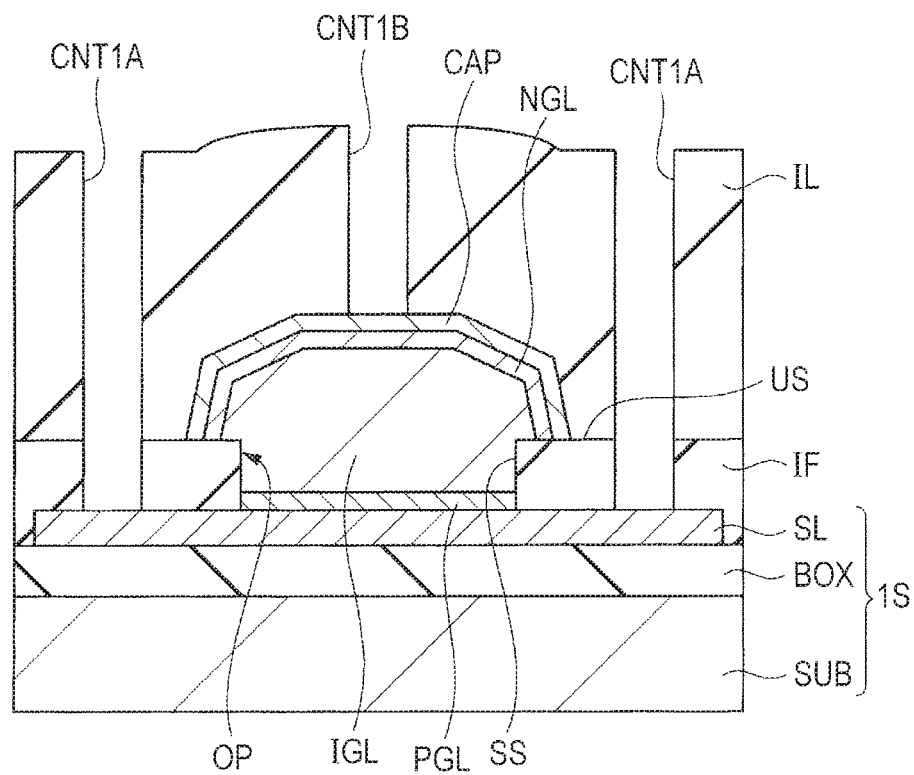
FIG. 8 is a cross-sectional view showing the manufacturing process of the semiconductor device following FIG. 7.

Continuously, as shown in FIG. 8, the interlayer insulating film IL is formed on the SOI substrate 1S as well as over the structure body of the Ge photodiode. The interlayer insulating film IL can be formed of, for example, silicon oxide, according to the CVD by way of example. Then, the contact hole CNT1A is formed penetrating the interlayer insulating film IL and the insulating film IF to arrive at the surface of the silicon layer SL of the SOI substrate 1S, according to the photolithography and the etching. Similarly, also the contact hole CNT1B ranging from the surface of the interlayer insulating film IL to the surface of the cap layer CAP is formed.

Next, as shown in FIG. 4, the barrier conductive film is formed on the surface of the interlayer insulating film IL including the contact hole CNT1A and the contact hole CNT1B, then the aluminum film (aluminum alloy film) is formed on the barrier conductive film, and further, the barrier conductive film is formed on the aluminum film. According to this, the plug PLG1A and the plug PLG1B embedded into the contact hole CNT1A and the contact hole CNT1B can be formed and at the same time, a stacked film (barrier conductive film+aluminum film+barrier conductive film) covering the surface of the interlayer insulating film IL can be formed. Here, the barrier conductive film can be formed of, for example, titanium (Ti film) and titanium nitride (TiN film), according to the sputtering by way of example. The aluminum film can be formed also according to the sputtering. Instead of the aluminum film, an aluminum alloy film (Al—Si—Cu film) can be used.

Then, the stacked film formed on the surface of the interlayer insulating film IL is patterned according to the photolithography and etching, hence to form the wiring L1A electrically coupled to the plug PLG1A and the wiring L1B electrically coupled to the plug PLG1B. As mentioned above, the semiconductor device including the Ge photodiode in the first embodiment can be manufactured.

Although in the first embodiment, the plug PLG1A and the plug PLG1B are formed of the barrier conductive film and the aluminum film, they are not restricted to these but the plug PLG1A and the plug PLG1B can be formed of, for example, barrier film and tungsten film. Further, the wiring L1A and the wiring L1B are not restricted to the aluminum wiring but they can be formed of, for example, copper wiring according to the damascene method.

<Characteristics in the First Embodiment>

Next, characteristic points in the first embodiment will be described. As the first characteristic point in the first embodiment, for example, as shown in FIG. 7, the p type germanium layer PGL, the intrinsic germanium layer IGL, and the n type germanium layer NGL forming the structure body of the Ge photodiode are formed according to the continuous selective epitaxial growth. According to this, the first embodiment can reduce the number of the processes by using the continuous selective epitaxial growth, instead of the ion implantation requiring a lot of processes. In other words, the first embodiment can reduce the manufacturing cost of the semiconductor device including the Ge photodiode because the number of the processes can be reduced. Further, as the first characteristic point, without using the ion implantation, the first embodiment can suppress the increase of the dark current in the Ge photodiode which could be caused by a damage according to the ion implantation. As the result, according to the first characteristic point, the first embodiment can improve both the manufacturing cost and the performance of the Ge photodiode.

The inventor et al., however, have found such a side effect of the above mentioned first characteristic point that because of the trapezoid shape (facet shape or forward taper shape) being formed by the property inherent in the continuous selective epitaxial growth (growth based on the crystal orientation), the p type germanium layer PGL gets closer to the n type germanium layer NGL. As the result, there is a fear of interdiffusion of conductivity type dopant occurring between the p type germanium layer PGL and the n type germanium layer NGL. When the interdiffusion occurs between the p type germanium layer PGL and the n type germanium layer NGL, the p type germanium layer PGL does not work well as the p type semiconductor layer and the n type germanium layer NGL does not work well as the n type semiconductor layer.

Then, the first embodiment has a second characteristic point as follows, in order to improve the performance of the Ge photodiode, while using the continuous selective epitaxial growth as the first characteristic point. Specifically, as the second characteristic point in the first embodiment, for example, as shown in FIG. 4, the insulating film IF including the opening portion OP is formed on the silicon layer SL of the SOI substrate 1S and the intrinsic germanium layer IGL is formed bulging from the opening portion OP to above the insulating film IF. In other words, the second characteristic point in the first embodiment is to make the cross section of the intrinsic germanium layer IGL a mushroom shape by using the insulating film IF where the opening portion OP is formed.

According to this, as shown in FIG. 4, the p type germanium layer PGL formed under the intrinsic germanium layer IGL is accommodated into the opening portion OP. On the other hand, the n type germanium layer NGL formed on the surface of the intrinsic germanium layer IGL is formed in contact with the surface of the intrinsic germanium layer IGL and the upper surface US of the insulating film IF, without contact with the opening portion OP. As the result, as shown in FIG. 4, a step made by the opening portion OP of the insulating film IF can suppress the approach of the p type germanium layer PGL to the n type germanium layer NGL. In short, according to the second characteristic point in the first embodiment, the intrinsic germanium layer IGL bulging from the opening portion OP to above the upper surface US of the insulating film IF avoids the contact of the p type germanium layer PGL with the n type germanium layer NGL. In other words, the p type germanium layer PGL is formed in contact with the inner wall surface of the opening portion OP (the side surface SS of the insulating film IF), while the n type germanium layer NGL is formed in contact with the upper surface US crossing the side surface SS of the insulating film IF. As the result, a gap (step) formed by the side surface SS and the upper surface US of the insulating film IF avoids the contact of the p type germanium layer PGL with the n type germanium layer NGL.

This means that the interdiffusion of the conductivity type dopant caused by the contact of the p type germanium layer PGL with the n type germanium layer NGL can be suppressed. Therefore, according to the second characteristic point in the first embodiment, the p type germanium layer PGL can work well as the p type semiconductor layer and the n type germanium layer NGL can work well as the n type semiconductor layer. Thus, the second characteristic point in the first embodiment can suppress the deterioration of the performance in the Ge photodiode.

As mentioned above, by the combination of the first characteristic point and the second characteristic point in the first embodiment, it is possible to improve both the manufacturing cost of the Ge photodiode and the performance of the Ge photodiode. Especially, according to the first characteristic point of using the continuous selective epitaxial growth instead of the ion implantation, the first embodiment can reduce the manufacturing cost and suppress the increase of the dark current which could be caused by a damage according to the ion implantation. Then, with the advantage of the first characteristic point kept as it is, the first embodiment can suppress such a side effect as the interdiffusion of the conductivity type dopant between the p type germanium layer PGL and the n type germanium layer NGL caused by their approach, according to the second characteristic point. In short, by combination of the first characteristic point and the second characteristic point, specifically by using the advantage of the first characteristic point and the compensation for the side effect of the first characteristic point by the second characteristic point, the first embodiment can obtain a remarkable effect that both the manufacturing cost and the performance can be improved in the semiconductor device including the Ge photodiode.

Second Embodiment

<Structure of Ge photodiode>

A Ge photodiode according to a second embodiment will be described. Since the Ge photodiode in the second embodiment has almost the same structure as that in the first embodiment, the difference point will be mainly described.

Figure 9:
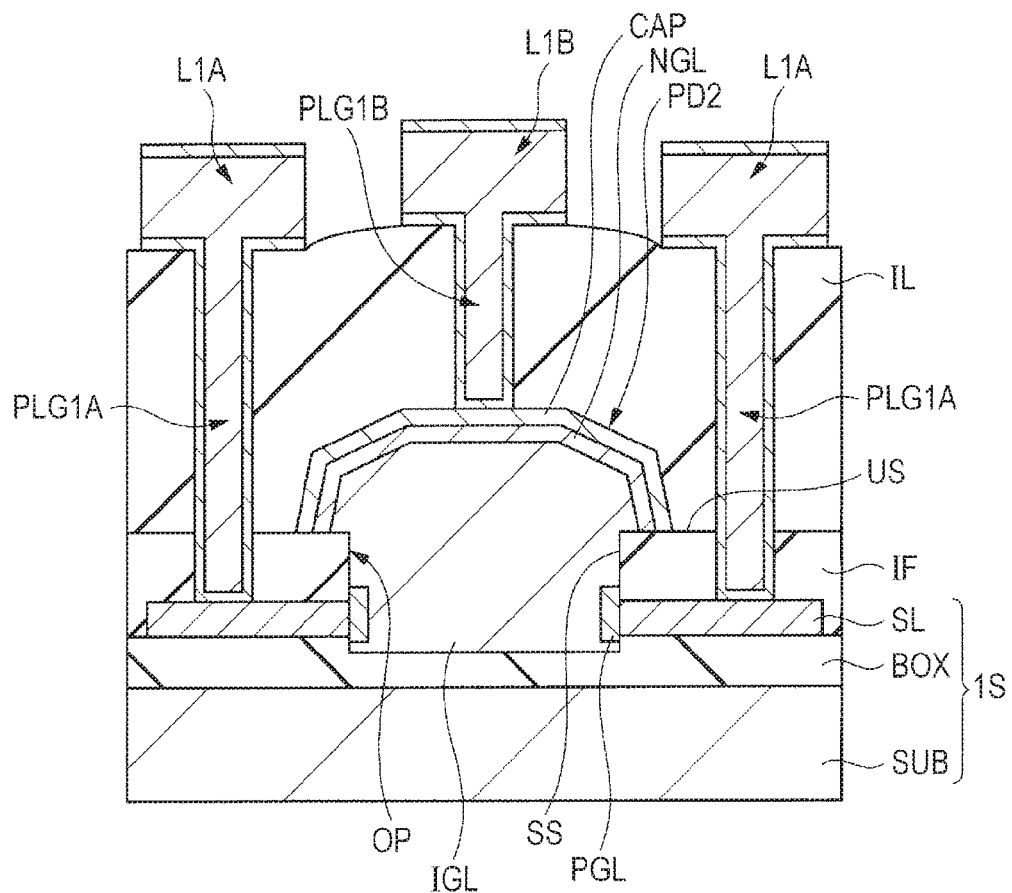
FIG. 9 is a cross-sectional view showing a structure of a Ge photodiode according to a second embodiment.

FIG. 9 is a cross-sectional view showing a structure of the Ge photodiode in the second embodiment. In FIG. 9, the Ge photodiode PD2 according to the second embodiment includes the silicon layer SL formed in the lower portion of the insulating film IF and the opening portion OP is formed penetrating the insulating film IF and the silicon layer SL. This opening portion OP arrives at the embedded insulating layer BOX formed under the silicon layer SL. In the Ge photodiode PD2 according to the second embodiment, the p type germanium layer PGL is in contact with the silicon layer SL bared from the inner wall surface of the opening portion OP. In short, the Ge photodiode PD2 according to the second embodiment is different from that of the first embodiment in that the opening portion OP penetrates not only the insulating film IF but also the silicon layer SL of the SOI substrate 1S, to arrive at the embedded insulating layer BOX of the SOI substrate 1S. As the result, in the first embodiment, for example, as shown in FIG. 4, the p type germanium layer PGL is formed on the silicon layer SL; on the other hand, in the second embodiment, the p type germanium layer PGL is formed on the side surface of the silicon layer SL bared from the inner wall surface of the opening portion OP. This is the characteristic point in the second embodiment.

According to this, as shown in FIG. 9, also in the Ge photodiode PD2 according to the second embodiment, the p type germanium layer PGL and the n type germanium layer NGL are out of contact with each other by the intrinsic germanium layer IGL formed bulging from the opening portion OP to above the upper surface US of the insulating film IF. As the result, also in the Ge photodiode PD2 according to the second embodiment can suppress the interdiffusion of the conductivity type dopant between the p type germanium layer PGL and the n type germanium layer NGL.

Further, as the advantage inherent in the Ge photodiode PD2 according to the second embodiment, the receiving light area of the Ge photodiode PD2 becomes larger for the light entering from the horizontal direction of the silicon layer SL as the optical waveguide; therefore, it is advantageous that the light receiving efficiency of the Ge photodiode PD2 can be improved. Specifically, according to the Ge photodiode PD1 in the first embodiment, the incident light can be received, for example, above the Ge photodiode PD1, as shown in FIG. 3 and also the incident light from the silicon layer SL (optical waveguide) formed in the lower portion of the Ge photodiode PD1 can be received, as shown in FIG. 4. Although this is true to the Ge photodiode PD2 in the second embodiment, the light receiving area of the Ge photodiode PD2 becomes larger for the light incident from the horizontal direction of the silicon layer SL in the structure of the Ge photodiode PD2 according to the second embodiment. According to this, when the Ge photodiode PD2 according to the second embodiment is applied to the structure of receiving light incident from the silicon layer SL as the optical waveguide, it can improve the light receiving efficiency advantageously.

<Manufacturing Method of Ge Photodiode>

Figure 10:
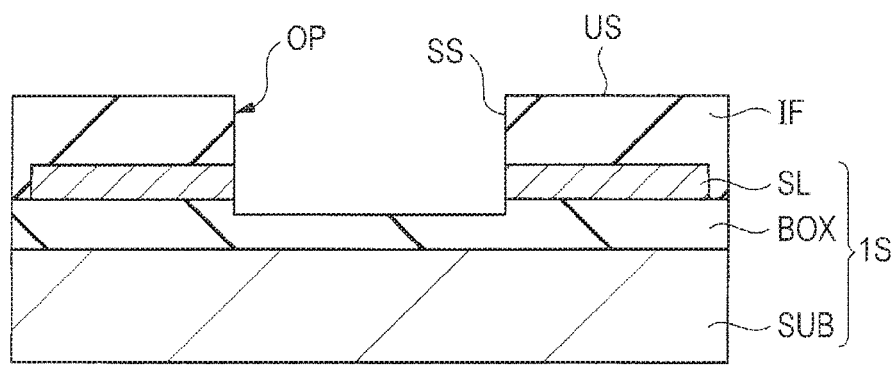
FIG. 10 is a cross-sectional view showing a manufacturing process of a semiconductor device according to the second embodiment.

A method of manufacturing a semiconductor device including the Ge photodiode PD2 according to the second embodiment will be described with reference to the drawings. At first, as shown in FIG. 10, the opening portion OP is formed penetrating the insulating film IF covering the patterned silicon layer SL and the silicon layer SL to arrive at the embedded insulating layer BOX of the SOI substrate 1S, according to the photolithography and the etching.

Figure 11:
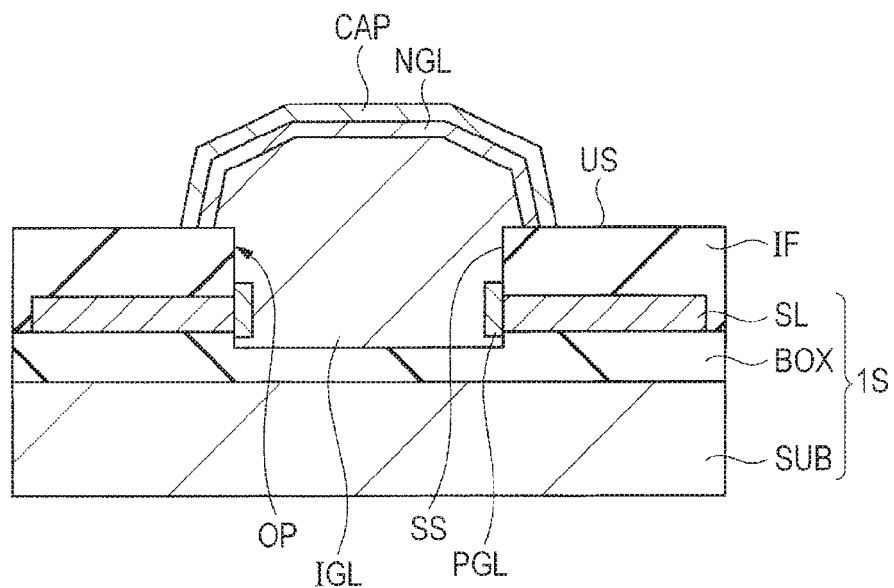
FIG. 11 is a cross-sectional view showing the manufacturing process of the semiconductor device following FIG. 10.

Next, as shown in FIG. 11, according to the selective epitaxial growth, the p type germanium layer PGL is formed staring from the surface of the silicon layer SL bared from the inner wall surface of the opening portion OP. Specifically, the p type germanium layer PGL forms a boron (B) doped germanium layer mainly according to the selective epitaxial growth including the monogerman gas and the diboran gas. Then, as shown in FIG. 11, similarly to the first embodiment, the intrinsic germanium layer IGL, the n type germanium layer NGL, and the cap layer CAP are sequentially formed according to the selective epitaxial growth with the supplying material gas switched. Here, as shown in FIG. 11, since the intrinsic germanium layer IGL is formed bulging from the opening portion OP to above the surface of the insulating film IF, the p type germanium layer PGL formed on the inner wall surface of the opening portion OP is distant from the n type germanium layer NGL in contact with the upper surface US of the insulating film IF, because of the positional relation between the side surface SS and the upper surface US of the insulating film IF. As the result, also according to the second embodiment, it is possible to suppress the interdiffusion of the conductivity type dopant between the p type germanium layer PGL and the n type germanium layer NGL caused by their approach.

Figure 12:
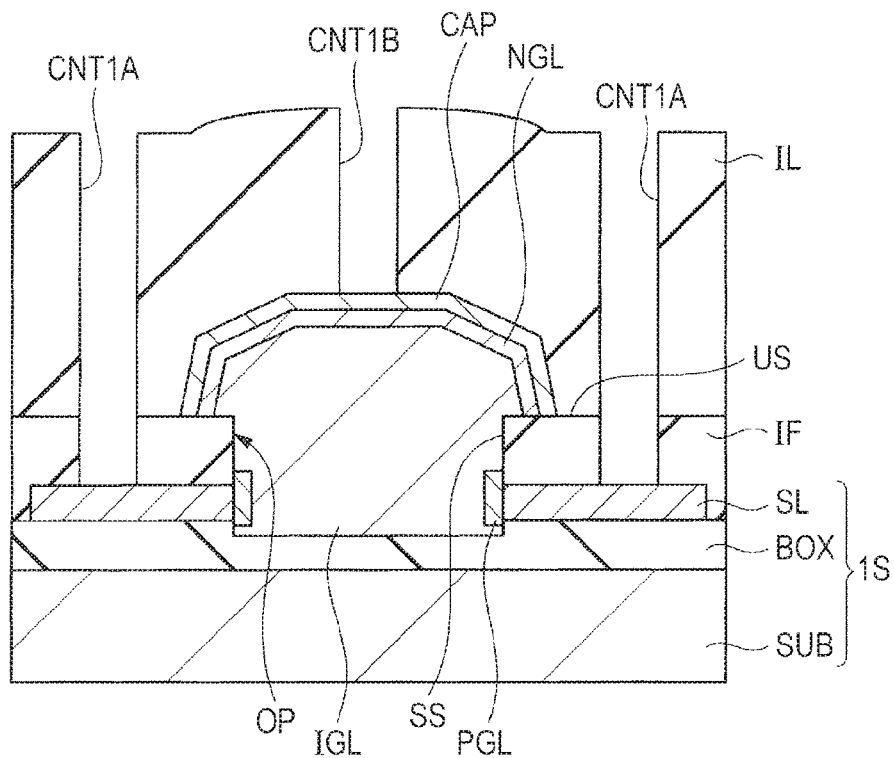
FIG. 12 is a cross-sectional view showing the manufacturing process of the semiconductor device following FIG. 11.

Then, as shown in FIG. 12, the interlayer insulating film IL is formed on the SOI substrate 1S as well as over the structure body of the Ge photodiode. The interlayer insulating film IL is formed of, for example, silicon oxide, according to the CVD by way of example. Then, the contact hole CNT1A is formed penetrating the interlayer insulating film IL and the insulating film IF to arrive at the surface of the silicon layer SL of the SOI substrate, according to the lithography and the etching. Similarly, the contact hole CNT1B ranging from the surface of the interlayer insulating film IL to the surface of the cap layer CAP is formed. By passing through the same process as the manufacturing process of the semiconductor device according to the first embodiment, a semiconductor device of the Ge photodiode PD2 according to the second embodiment can be manufactured as shown in FIG. 9.

Third Embodiment

<Structure of Ge Photodiode>

A Ge photodiode according to a third embodiment will be described. Since the Ge photodiode in the third embodiment has almost the same structure as that in the first embodiment, the difference point will be mainly described.

Figure 13:
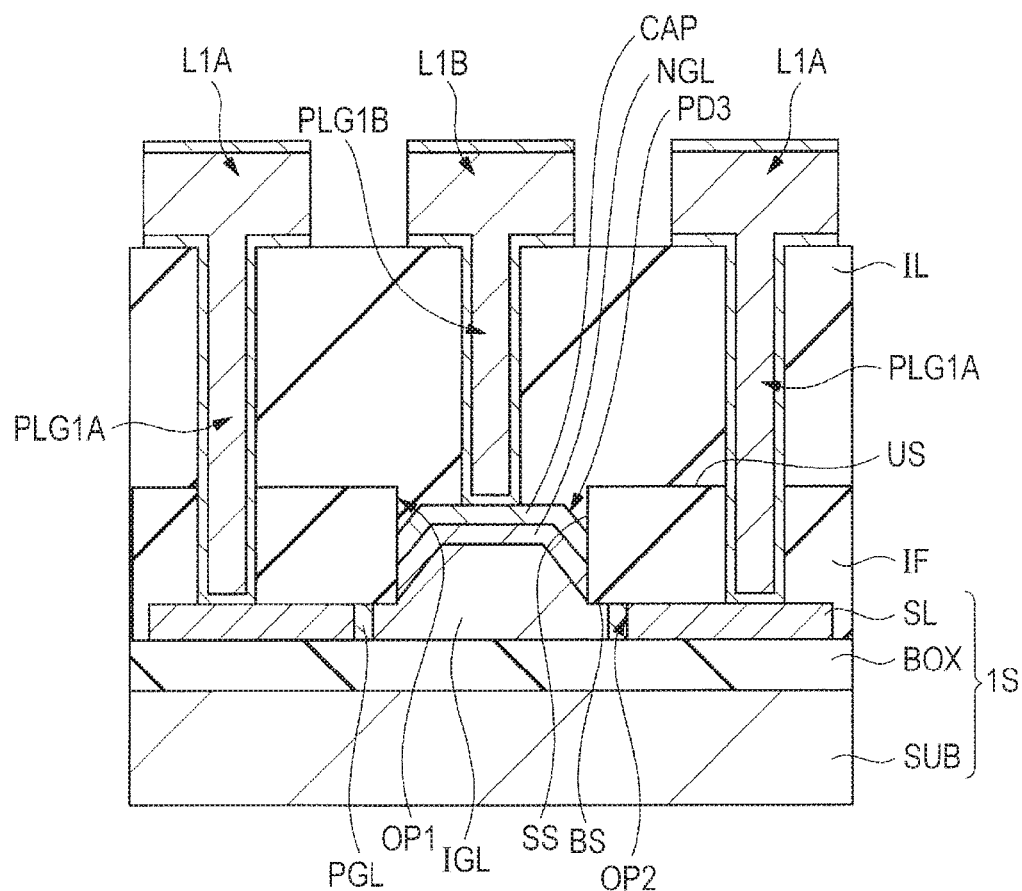
FIG. 13 is a cross-sectional view showing a structure of a Ge photodiode according to a third embodiment.

FIG. 13 is a cross-sectional view showing a structure of the Ge photodiode in the third embodiment. In FIG. 13, the Ge photodiode PD3 according to the third embodiment includes the silicon layer SL on the embedded insulating layer BOX and the opening portion OP2 is formed penetrating the silicon layer SL. The insulating film IF is formed on the silicon layer SL having the opening portion OP2, and the opening portion OP1 is formed penetrating the insulating film IF. As shown in FIG. 13, the opening portion OP1 formed in the insulating film IF communicates with the opening portion OP2 formed in the silicon layer SL and the opening portion OP2 covers the opening portion OP1. In other words, the opening portion OP2 is bigger than the opening portion OP1 in size. As the result, as shown in FIG. 13, a part of the bottom surface BS of the insulating film IF is bared from the opening portion OP2.

The p type germanium layer PGL is formed in contact with the silicon layer SL bared from the side surface of the opening portion OP2, as shown in FIG. 13 and this p type germanium layer PGL is in contact with the bottom surface BS of the insulating film IF bared from the opening portion OP2. Here, the p type germanium layer PGL does not bulge into the opening portion OP1. Stated differently, in plan view, the p type germanium layer PGL is arranged not to overlap the opening portion OP1 formed in the insulating film IF, and further, in plan view, the p type germanium layer PGL is arranged outside the opening portion OP1 formed in the insulating film IF.

Continuously, as shown in FIG. 13, the intrinsic germanium layer IGL fills the opening portion OP2 and is embedded into the opening portion OP1, and the n type germanium layer NGL is formed on the intrinsic germanium layer IGL. Here, the n type germanium layer NGL is formed in contact with the side surface SS (the inner wall surface of the opening portion OP1) of the insulating film IF bared from the opening portion OP1. Further, the cap layer CAP is formed on the n type germanium layer NGL. Here, the upper surface of the cap layer CAP is lower than the upper surface US of the insulating film IF. As shown in FIG. 13, the intrinsic germanium layer IGL, the n type germanium layer NGL, and the cap layer CAP are formed inside the opening portion OP1 formed in the insulating film IF, in a way of not bulging from the opening portion OP1.

As mentioned above, the semiconductor device including the Ge photodiode PD3 according to the third embodiment includes the silicon layer SL formed under the insulating film IF, the opening portion OP1 penetrating the insulating film IF, and the opening portion OP2 penetrating the silicon layer SL, communicating with the opening portion OP1, and covering the opening portion OP1 in plan view. Here, the p type germanium layer PGL is in contact with the silicon layer SL bared from the inner wall surface of the opening portion OP2 and the bottom surface BS of the insulating film IF bared from the opening portion OP2. Further, the n type germanium layer NGL is formed in contact with the inner wall surface of the opening portion OP1. Especially, in the third embodiment, as shown in FIG. 13, the cap layer CAP is lower than the upper surface US of the insulating film IF in height.

As the characteristic point in the third embodiment, for example, as shown in FIG. 13, the p type germanium layer PGL is formed in contact with the silicon layer SL bared from the opening portion OP2 and the bottom surface BS of the insulating film IF bared from the opening portion OP2, in a way of not overlapping the opening portion OP1 in plan view and the n type germanium layer NGL is formed in contact with the inner wall surface of the opening portion OP1. In this case, as shown in FIG. 13, the intrinsic germanium layer IGL fills the opening portion OP2 and is embedded into the opening portion OP1. According to this, in the Ge photodiode PD3 of the third embodiment, the p type germanium layer PGL is distant from the n type germanium layer NGL by the intrinsic germanium layer IGL. In short, according to the Ge photodiode PD3 in the third embodiment, the p type germanium layer PGL formed on the inner wall surface of the opening portion OP2 is distinct from the n type germanium layer NGL in contact with the inner wall surface of the opening portion OP1 (the side surface SS of the insulating film IF) because of the positional relation of the side surface SS and the bottom surface BS of the insulating film IF. As the result, also according to the third embodiment, it is possible to suppress the interdiffusion of the conductivity type dopant between the p type germanium layer PGL and the n type germanium layer NGL caused by their approach.

Further, according to the Ge photodiode PD3 in the third embodiment, as shown in FIG. 13, the cap layer CAP is formed inside the opening portion OP1 formed in the insulating film IF without bulging to the upper surface US of the insulating film IF. As the result, since the structure body of the Ge photodiode PD3 does not get higher than the upper surface US of the insulating film IF, it is possible to improve the flatness on the surface (upper surface) of the interlayer insulating film IL formed to cover the Ge photodiode PD3.

<Manufacturing Method of Ge Photodiode>

A method of manufacturing a semiconductor device including the Ge photodiode according to the third embodiment will be described with reference to the drawings. At first, as shown in FIG. 14, the opening portion OP1 penetrating the insulating film IF covering the patterned silicon layer SL is formed according to the photolithography and the etching.

Figure 14:
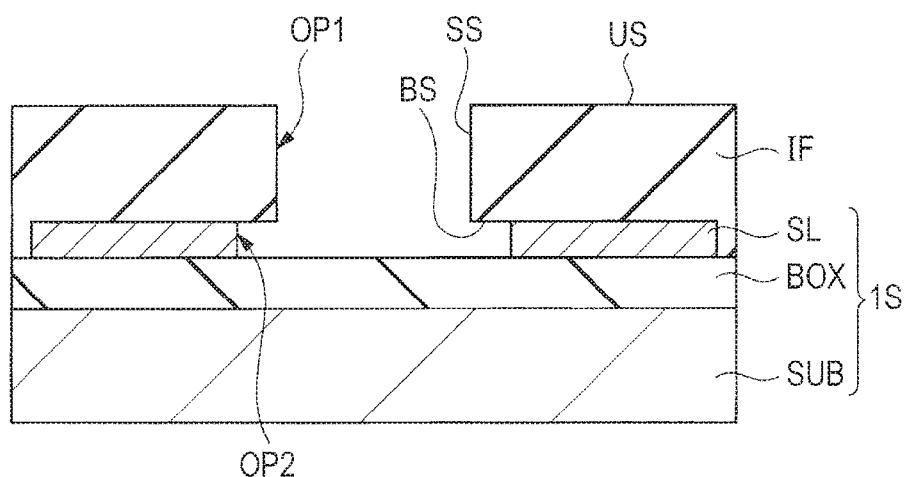
FIG. 14 is a cross-sectional view showing a manufacturing process of a semiconductor device according to the third embodiment.

Then, as shown in FIG. 14, the opening portion OP2 penetrating the silicon layer SL is formed by isotropically etching the silicon layer SL bared from the bottom surface of the opening portion OP1. Here, by using the isotropic etching, the silicon layer SL is etched not only in a vertical direction (thickness direction) but also in a horizontal direction and therefore, as shown in FIG. 14, the opening portion OP2 formed in the silicon layer SL gets larger than the opening portion OP1 formed in the insulating film IF. In other words, in plan view, the opening portion OP2 is formed to cover the opening portion OP1. As the result, a part of the bottom surface BS of the insulating film IF is bared from the opening portion OP2. As the isotropic etching, isotropically dry etching and wet etching can be used.

Figure 15:
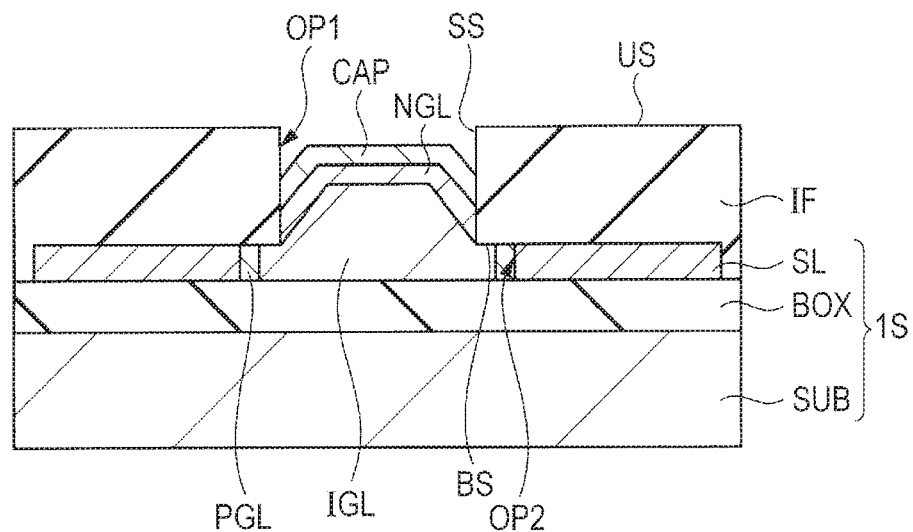
FIG. 15 is a cross-sectional view showing the manufacturing process of the semiconductor device following FIG. 14.

Next, as shown in FIG. 15, the p type germanium layer PGL is formed inside the opening portion OP2, starting from the silicon layer SL bared from the inner wall surface of the opening portion OP2, according to the selective epitaxial growth. Here, the p type germanium layer PGL is formed in contact with the side surface of the silicon layer SL bared from the opening portion OP2 and the bottom surface BS of the insulating film IF, in a way of not overlapping the opening portion OP1 in plan view. The p type germanium layer PGL is formed not to bulge to the opening portion OP1. Then, according to the continuous selective epitaxial growth within the same chamber, the intrinsic germanium layer IGL is formed inside the opening portion OP2 forming the p type germanium layer PGL as well as the opening portion OP1 formed in the insulating film IF. Continuously, according to the continuous selective epitaxial growth within the same chamber, the n type germanium layer NGL is formed within the opening portion OP1 where the intrinsic germanium layer IGL is formed. Further, according to the continuous selective epitaxial growth within the same chamber, the cap layer CAP covering the n type germanium layer NGL is formed within the opening portion OP1. Here, the cap layer CAP is formed in a way of not bulging from the opening portion OP1.

Figure 16:
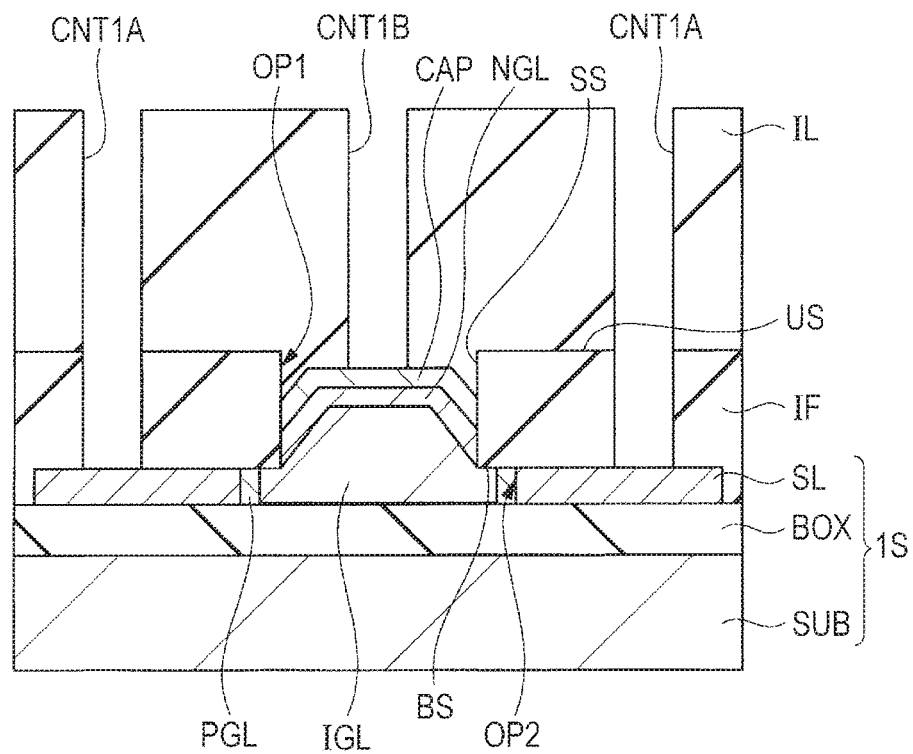
FIG. 16 is a cross-sectional view showing the manufacturing process of the semiconductor device following FIG. 15.

Then, as shown in FIG. 16, the interlayer insulating film IL is formed on the insulating film IF as well as over the structure body of the Ge photodiode. The interlayer insulating film IL can be formed of, for example, silicon oxide, according to the CVD by way of example. The contact hole CNT1A is formed penetrating the interlayer insulating film IL and the insulating film IF to arrive at the surface of the silicon layer SL of the SOI substrate, according to the photolithography and the etching. Similarly, the contact hole CNT1B is formed ranging from the surface of the interlayer insulating film IL to the surface of the cap layer CAP. Through the same process as the manufacturing process of the semiconductor device according to the first embodiment, it is possible to manufacture the semiconductor device including the Ge photodiode PD3 according to the third embodiment as shown in FIG. 13.

Fourth Embodiment

<Structure of Ge Photodiode>

A Ge photodiode according to a fourth embodiment will be described. Since the Ge photodiode in the fourth embodiment has almost the same structure as that in the first embodiment, the difference point will be mainly described.

Figure 17:
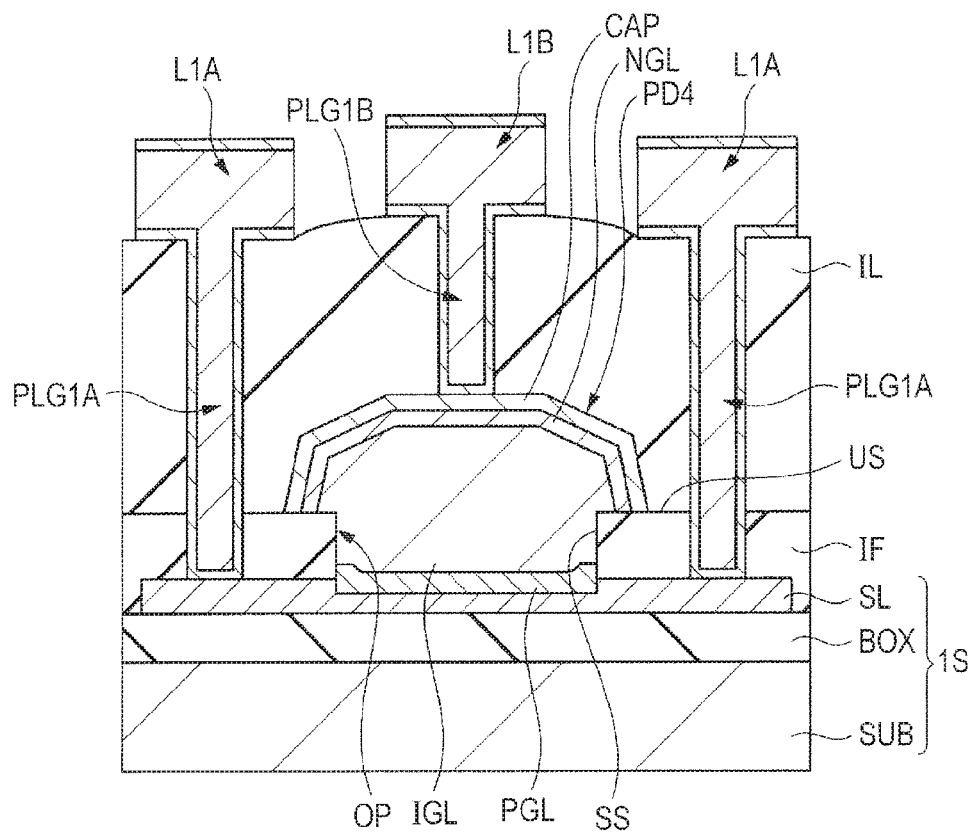
FIG. 17 is a cross-sectional view showing a structure of a Ge photodiode according to a fourth embodiment.

FIG. 17 is a cross-sectional view showing a structure of the Ge photodiode in the fourth embodiment. In FIG. 17, the Ge photodiode PD4 according to the fourth embodiment includes the silicon layer SL on the embedded insulating layer BOX and the insulating film IF is formed to cover the silicon layer SL. The opening portion OP is formed penetrating the insulating film IF and further deep on the way to the silicon layer SL. The p type germanium layer PGL is formed on the silicon layer SL bared from the opening portion OP and the inner wall surface of the opening portion OP. Further, the intrinsic germanium layer IGL is formed on the p type germanium layer PGL, bulging from the opening portion OP to above the upper surface US of the insulating film IF. The n type germanium layer NGL is formed to cover the surface of the intrinsic germanium layer IGL and the end portion of the n type germanium layer NGL is in contact with the upper surface US of the insulating film IF. The cap layer CAP is formed to cover the surface of the n type germanium layer NGL and the end portion of the cap layer CAP is in contact with the upper surface US of the insulating film IF.

As mentioned above, the semiconductor device including the Ge photodiode PD4 according to the fourth embodiment includes the silicon layer SL formed under the insulating film IF and the opening portion OP penetrating the insulating film IF to arrive at the inside of the silicon layer SL. Here, the p type germanium layer PGL is in contact with the inner wall surface of the opening portion OP and the bottom surface of the opening portion OP. Further, the n type germanium layer NGL is in contact with the upper surface US of the insulating film IF.

As shown in FIG. 17, also according to the Ge photodiode PD4 in the fourth embodiment, the p type germanium layer PGL is distant from the n type germanium layer NGL because of the intrinsic germanium layer IGL bulging from the opening portion OP to above the upper surface US of the insulating film IF. As the result, also in the Ge photodiode PD4 according to the fourth embodiment, it is possible to suppress the interdiffusion of the conductivity type dopant between the p type germanium layer PGL and the n type germanium layer NGL.

Further, as the advantage of the Ge photodiode PD4 according to the fourth embodiment, the light receiving area of the Ge photodiode PD4 gets larger for the light incident from the horizontal direction of the silicon layer SL as the optical waveguide. Therefore, according to the fourth embodiment, it is advantageous that the light receiving efficiency of the Ge photodiode PD4 can be improved.

<Manufacturing Method of Ge Photodiode>

Figure 18:
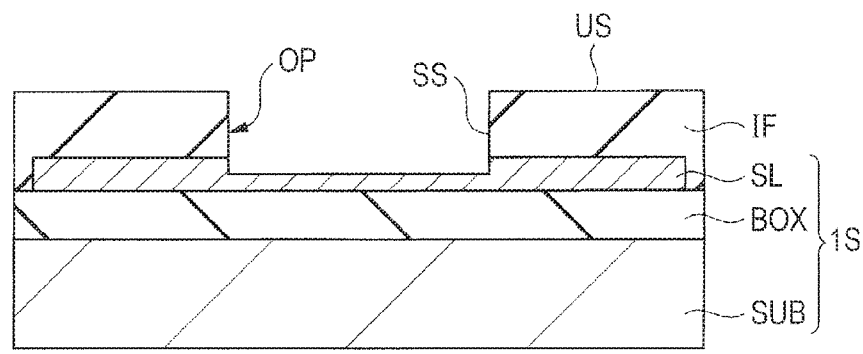
FIG. 18 is a cross-sectional view showing a manufacturing process of a semiconductor device according to the fourth embodiment.

A method of manufacturing a semiconductor device including the Ge photodiode according to the fourth embodiment will be described with reference to the drawings. At first, as shown in FIG. 18, the opening portion OP is formed penetrating the insulating film IF covering the patterned silicon layer SL to arrive at the inside of the silicon layer SL, according to the photolithography and the etching.

Figure 19:
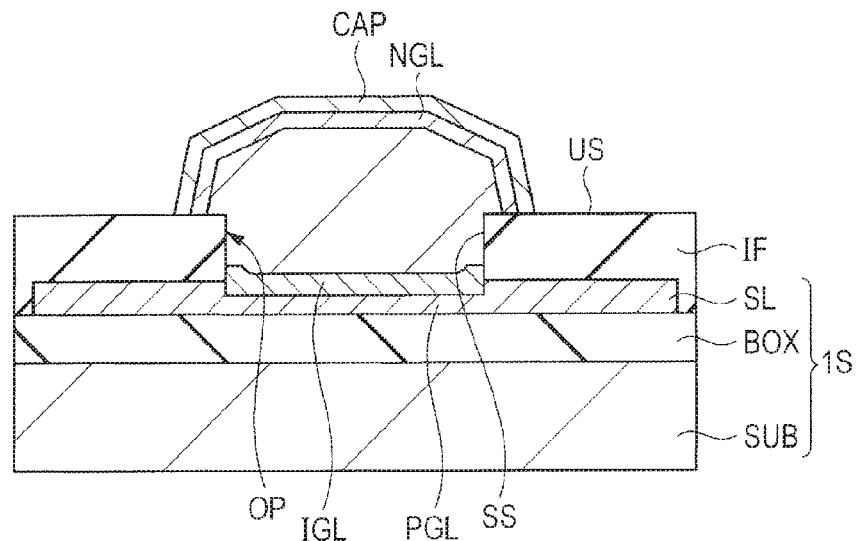
FIG. 19 is a cross-sectional view showing the manufacturing process of the semiconductor device following FIG. 18.

As shown in FIG. 19, according to the selective epitaxial growth, the p type germanium layer PGL is formed starting from the surface of the silicon layer SL bared from the inner wall surface and the bottom surface of the opening portion OP. Specifically, the p type germanium layer PGL forms a boron (B) doped germanium layer, mainly according to the selective epitaxial growth including the monogerman gas and the diboran gas. Then, as shown in FIG. 19, the intrinsic germanium layer IGL, the n type germanium layer NGL, and the cap layer CAP are sequentially formed according to the selective epitaxial growth with the supplying gas switched, similarly to the first embodiment. Here, as shown in FIG. 19, since the intrinsic germanium layer IGL is formed bulging from the opening portion OP to above the surface of the insulating film IF, the p type germanium layer PGL formed on the inner wall surface of the opening portion OP is distant from the n type germanium layer NGL in contact with the upper surface US of the insulating film IF because of the positional relation between the side surface SS and the upper surface US of the insulating film IF. As the result, also according to the fourth embodiment, it is possible to suppress the interdiffusion of the conductivity type dopant between the p type germanium layer PGL and the n type germanium layer NGL caused by their approach. Since the process thereafter is the same as the first embodiment, the description thereof is omitted. As mentioned above, the semiconductor device according to the fourth embodiment can be manufactured.

Fifth Embodiment

A Ge photodiode according to a fifth embodiment will be described. Since the Ge photodiode in the fifth embodiment has almost the same structure as that in the first embodiment, the difference point will be mainly described.

Figure 20:
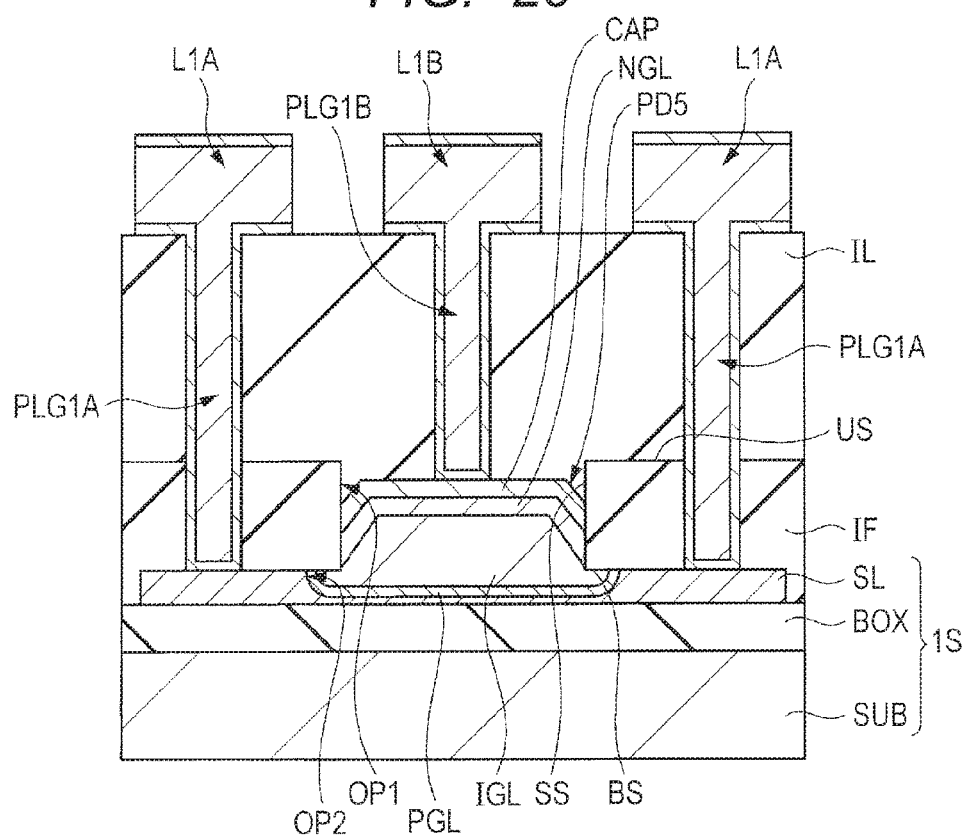
FIG. 20 is a cross-sectional view showing a structure of a Ge photodiode according to a fifth embodiment.

FIG. 20 is a cross-sectional view showing a structure of the Ge photodiode in the fifth embodiment. In FIG. 20, the Ge photodiode PD5 according to the fifth embodiment includes the silicon layer SL on the embedded insulating layer BOX and the opening portion OP2 is formed in the silicon layer SL to arrive at the inner portion of the silicon layer SL. Here, the inner wall surface of the opening portion OP2 is formed, for example, in a round shape. Then, the insulating film IF is formed on the silicon layer SL having the opening portion OP2 and the insulating film IF has the opening portion OP1 penetrating the insulating film IF. As shown in FIG. 20, the opening portion OP1 formed in the insulating film IF communicates with the opening portion OP2 formed in the silicon layer SL, and the opening portion OP2 covers the opening portion OP1. In other words, the opening portion OP2 is larger than the opening portion OP1. As the result, as shown in FIG. 20, a part of the bottom surface BS of the insulating film IF is bared from the opening portion OP2.

As shown in FIG. 20, the p type germanium layer PGL is formed in contact with the silicon layer SL bared from the roundish side surface of the opening portion OP2 and the p type germanium layer PGL is in contact with the bottom surface BS of the insulating film IF bared from the opening portion OP2. Here, the p type germanium layer PGL does not bulge to the inside of the opening portion OP1.

Continuously, as shown in FIG. 20, the intrinsic germanium layer IGL fills the opening portion OP2 and is embedded into the opening portion OP1, and the n type germanium layer NGL is formed on the intrinsic germanium layer IGL. Here, the n type germanium layer NGL is formed in contact with the side surface SS of the insulating film IF (the inner wall surface of the opening portion OP1) bared from the opening portion OP1. Further, the cap layer CAP is formed on the n type germanium layer NGL. Here, the upper surface of the cap layer CAP is lower than the upper surface US of the insulating film IF. Specifically, as shown in FIG. 20, the intrinsic germanium layer IGL, the n type germanium layer NGL, and the cap layer CAP are formed inside the opening portion OP1 formed in the insulating film IF in a way of not bulging from the opening portion OP1.

As mentioned above, the semiconductor device including the Ge photodiode PD5 according to the fifth embodiment includes the silicon layer SL formed under the insulating film IF, the opening portion OP1 penetrating the insulating film IF, and the opening portion OP2 formed in the silicon layer SL, communicating with the opening portion OP1 and covering the opening portion OP1 in plan view. Here, the inner wall surface of the opening portion OP2 has a round shape. The p type germanium layer PGL is in contact with the inner wall surface of the opening portion OP2, the bottom surface of the opening portion OP2, and the bottom surface BS of the insulating film IF bared from the opening portion OP2. Further, the n type germanium layer NGL is in contact with the inner wall surface of the opening portion OP1. The cap layer CAP is lower than the upper surface US of the insulating film IF in height.

<Manufacturing Method of Ge Photodiode>

A method of manufacturing a semiconductor device including the Ge photodiode according to the fifth embodiment will be described with reference to the drawings. At first, as shown in FIG. 21, the opening portion OP1 is formed penetrating the insulating film IF covering the patterned silicon layer SL, according to the photolithography and the etching.

Figure 21:
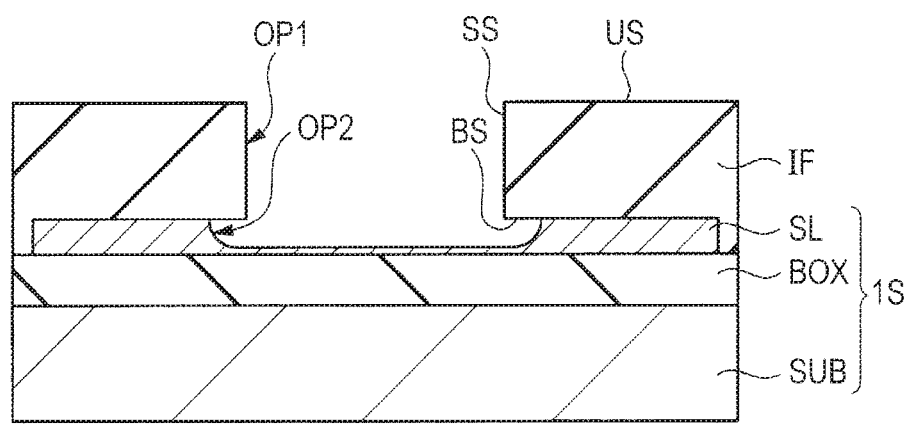
FIG. 21 is a cross-sectional view showing a manufacturing process of a semiconductor device according to the fifth embodiment.

Then, as shown in FIG. 21, the opening portion OP2 is formed penetrating the silicon layer SL by isotropically etching the silicon layer SL bared from the bottom surface of the opening portion OP1. Here, by using the isotropic etching, the silicon layer SL is etched not only in a vertical direction (thickness direction) but also in a horizontal direction and therefore, as shown in FIG. 21, the opening portion OP2 formed in the silicon layer SL gets larger than the opening portion OP1 formed in the insulating film IF. In other words, in plan view, the opening portion OP2 is formed to cover the opening portion OP1. As the result, a part of the bottom surface BS of the insulating film IF is bared from the opening portion OP2. As the isotropic etching, isotropically dry etching and wet etching can be used. Here, in the fifth embodiment, by properly adjusting the conditions of the isotropic etching, the inner wall surface of the opening portion OP2 can be formed in a roundish shape.

Figure 22:
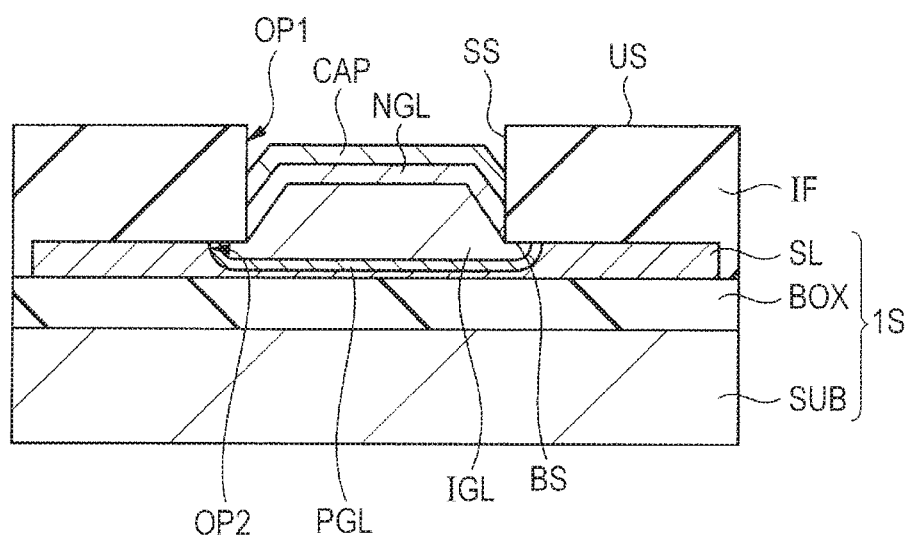
FIG. 22 is a cross-sectional view showing the manufacturing process of the semiconductor device following FIG. 21.

Next, as shown in FIG. 22, the p type germanium layer PGL is formed inside the opening portion OP2, starting from the silicon layer SL bared from the inner wall surface of the opening portion OP2, according to the selective epitaxial growth. Here, the p type germanium layer PGL is formed in contact with the side surface of the silicon layer SL bared from the opening portion OP2 and the bottom surface BS of the insulating film IF in a way of not overlapping the opening portion OP1 in plan view. In short, the p type germanium layer PGL is formed not to bulge into the opening portion OP1. Especially, in the fifth embodiment, since the inner wall surface of the opening portion OP2 is formed in a round shape, it is easy to arrange the p type germanium layer PGL not to bulge into the opening portion OP1.

Thereafter, the intrinsic germanium layer IGL is formed inside the opening portion OP2 having the p type germanium layer PGL as well as the opening portion OP1 formed in the insulating film IF, according to the continuous selective epitaxial growth within the same chamber. Continuously, the n type germanium layer NGL is formed inside the opening portion OP1 having the intrinsic germanium layer IGL, according to the continuous selective epitaxial growth within the same chamber. Further, the cap layer CAP covering the n type germanium layer NGL is formed inside the opening portion OP1, according to the continuous selective epitaxial growth within the same chamber. Here, the cap layer CAP is formed not to bulge from the opening portion OP1.

The process thereafter is the same as that of the first embodiment and therefore, the description is omitted. As mentioned above, the semiconductor device according to the fifth embodiment can be manufactured.

As set forth hereinabove, although the invention made by the inventor et al. have been described specifically based on the embodiments, it is needless to say that various modifications can be made without departing from its spirit.

What is claimed is:

1. A semiconductor device provided with a light receiving element including a photoelectric conversion function,
   wherein the light receiving element includes:
      an insulating film including a first surface and a second surface crossing the first surface;
      a first semiconductor layer of a first conductivity type in contact with the first surface of the insulating film;
      an intrinsic semiconductor layer formed over the first semiconductor layer in contact with the first surface and the second surface of the insulating film; and
      a second semiconductor layer of a second conductivity type, opposite to the first conductivity type, formed over the intrinsic semiconductor layer in contact with the second surface of the insulating film.

2. The device according to claim 1, wherein an opening portion penetrating the insulating film is formed in the insulating film,
   wherein the first surface of the insulating film includes an inner wall surface of the opening portion, and
   wherein the second surface of the insulating film includes an upper surface of the insulating film.

3. The device according to claim 2, wherein the semiconductor device includes a semiconductor layer,
   wherein the opening portion penetrating the insulating film is formed over the semiconductor layer, and
   wherein the first semiconductor layer is formed over the semiconductor layer bared by the opening portion.

4. The device according to claim 3, wherein the semiconductor layer includes an optical waveguide layer.

5. The device according to claim 4, wherein a bandgap of the semiconductor layer is larger than a bandgap of any layer of the first semiconductor layer, the intrinsic semiconductor layer, and the second semiconductor layer.

6. The device according to claim 1, wherein the semiconductor device includes:
   a semiconductor layer formed under the insulating film; and
   an opening portion penetrating the insulating film and the semiconductor layer, and
   wherein the first semiconductor layer is in contact with the semiconductor layer bared by the inner wall surface of the opening portion.

7. The device according to claim 1, wherein the semiconductor device includes:
   a semiconductor layer formed under the insulating film;
   a first opening portion penetrating the insulating film; and
   a second opening portion penetrating the semiconductor layer, communicating with the first opening portion, and covering the first opening portion in a plan view,
   wherein the first semiconductor layer is in contact with the semiconductor layer bared by an inner wall surface of the second opening portion and a lower surface of the insulating film bared by the second opening portion,
   wherein the second semiconductor layer is in contact with an inner wall surface of the first opening portion,
   wherein the first surface of the insulating film includes the lower surface of the insulating film, and
   wherein the second surface of the insulating film includes the inner wall surface of the first opening portion.

8. The device according to claim 7, wherein the second semiconductor layer is lower than an upper surface of the insulating film in height.

9. The device according to claim 1, wherein the semiconductor device includes:
   a semiconductor layer formed under the insulating film; and
   an opening portion penetrating the insulating film to arrive at an inside of the semiconductor layer,
   wherein the first semiconductor layer is in contact with an inner wall surface of the opening portion and a bottom surface of the opening portion,
   wherein the second semiconductor layer is in contact with an upper surface of the insulating film,
   wherein the first surface of the insulating film includes the inner wall surface of the opening portion, and
   wherein the second surface of the insulating film includes the upper surface of the insulating film.

10. The device according to claim 1, wherein the semiconductor device includes:
    a semiconductor layer formed under the insulating film;
    a first opening portion penetrating the insulating film; and
    a second opening portion formed in the semiconductor layer, communicating with the first opening portion and covering the first opening portion in a plan view,
    wherein the first semiconductor layer is in contact with an inner wall surface of the second opening portion, a bottom surface of the second opening portion, and a lower surface of the insulating film bared by the second opening portion,
    wherein the second semiconductor layer is in contact with an inner wall surface of the first opening portion,
    wherein the first surface of the insulating film includes the lower surface of the insulating film, and
    wherein the second surface of the insulating film includes the inner wall surface of the first opening portion.

11. The device according to claim 10, wherein the inner wall surface of the second opening portion has a round shape.

12. The device according to claim 10, wherein the second semiconductor layer is lower than an upper surface of the insulating film in height.

13. The device according to claim 1, wherein the semiconductor device includes a semiconductor layer under the light receiving element,
   wherein the semiconductor layer includes a silicon layer,
   wherein the first semiconductor layer includes a first germanium layer,
   wherein the intrinsic semiconductor layer includes an intrinsic germanium layer, and
   wherein the second semiconductor layer includes a second germanium layer.

14. The device according to claim 1, wherein the light receiving element is designed to be able to receive light above the light receiving element.

* * * * *